United States Patent
Stokes et al.

(10) Patent No.: US 7,554,109 B2
(45) Date of Patent: Jun. 30, 2009

(54) QUANTUM DOT OPTOELECTRONIC DEVICES WITH NANOSCALE EPITAXIAL LATERAL OVERGROWTH AND METHODS OF MANUFACTURE

(75) Inventors: Edward B. Stokes, Charlotte, NC (US); Mohamed-Ali Hasan, Concord, NC (US); Kamal Sunderasan, Charlotte, NC (US); Jennifer G. Pagan, Charlotte, NC (US)

(73) Assignee: Dot Metrics Technology, Inc., Charlotte, NC (US)

( * ) Notice: Subject to any disclaimer, the term of this patent is extended or adjusted under 35 U.S.C. 154(b) by 170 days.

(21) Appl. No.: 10/933,941

(22) Filed: Sep. 3, 2004

(65) Prior Publication Data

US 2005/0051766 A1    Mar. 10, 2005

Related U.S. Application Data

(60) Provisional application No. 60/500,273, filed on Sep. 5, 2003.

(51) Int. Cl.
*H01L 29/205* (2006.01)
(52) U.S. Cl. .......... 257/17; 257/E29.071; 257/E33.034; 977/816; 977/817
(58) Field of Classification Search ............... 257/17
See application file for complete search history.

(56) References Cited

U.S. PATENT DOCUMENTS

| | | | |
|---|---|---|---|
| 5,079,186 A | 1/1992 | Narusawa | |
| 6,501,091 B1 | 12/2002 | Bawendi et al. | |
| 6,639,354 B1 * | 10/2003 | Kojima et al. | 313/498 |
| 6,649,942 B2 | 11/2003 | Hata et al. | |
| 6,713,954 B2 | 3/2004 | Wakahara et al. | |
| 6,720,196 B2 | 4/2004 | Kunisato et al. | |
| 6,864,502 B2 | 3/2005 | Shibata et al. | |
| 6,943,377 B2 | 9/2005 | Gaska et al. | |
| 7,053,420 B2 | 5/2006 | Takatomo et al. | |
| 2002/0013042 A1 | 1/2002 | Morkoc | |
| 2002/0022286 A1 | 2/2002 | Nikolaev et al. | |
| 2002/0075924 A1 | 6/2002 | Mukai | |
| 2002/0127224 A1 | 9/2002 | Chen | |
| 2002/0136932 A1 | 9/2002 | Yoshida | |
| 2003/0142944 A1 | 7/2003 | Sundar et al. | |
| 2004/0023010 A1 | 2/2004 | Bulovic et al. | |
| 2005/0230673 A1 * | 10/2005 | Mueller et al. | 257/13 |

FOREIGN PATENT DOCUMENTS

CN    1 403 379 A    3/2003
JP    09148624    6/1997

* cited by examiner

*Primary Examiner*—Jerome Jackson, Jr.
(74) *Attorney, Agent, or Firm*—Lee & Morse, P.C.

(57) ABSTRACT

Optoelectronic devices are provided that incorporate quantum dots as the electroluminescent layer in an inorganic wide-bandgap heterostructure. The quantum dots serve as the optically active component of the device and, in multilayer quantum dot embodiments, facilitate nanoscale epitaxial lateral overgrowth (NELOG) in heterostructures having non-lattice matched substrates. The quantum dots in such devices will be electrically pumped and exhibit electroluminescence, as opposed to being optically pumped and exhibiting photoluminescence. There is no inherent "Stokes loss" in electroluminescence thus the devices of the present invention have potentially higher efficiency than optically pumped quantum dot devices. Devices resulting from the present invention are capable of providing deep green visible light, as well as, any other color in the visible spectrum, including white light by blending different sizes and compositions of the dots and controlling manufacturing processes.

57 Claims, 9 Drawing Sheets

QUANTUM DOT OPTOELECTRONIC DEVICES WITH NANOSCALE EPITAXIAL LATERAL OVERGROWTH AND METHODS OF MANUFACTURE

CROSS-REFERENCE TO RELATED APPLICATIONS

This application claims the benefit of U.S. Provisional Application No. 60/500,273, filed Sep. 5, 2003, entitled *Quantu Dot Optoelectronic Devices (Q-DOD) with Nanoscale Epitaxial Lateral Overgrowth (NELOG)*, the contents of which are incorporated herein by reference in its entirety.

FIELD OF THE INVENTION

The present invention relates to optoelectronic devices and, more specifically, to devices incorporating quantum dots that (1) serve as active layers and (2) facilitate nanoscale epitaxial lateral overgrowth and (3) facilitate methods for manufacture of optoelectronic devices.

BACKGROUND OF THE INVENTION

Semiconductor Light Emitting Diodes, commonly referred to as LEDs, were introduced in the 1960's when visible red light was produced using gallium arsenide phosphide (GaAsP) on a GaAs substrate (Ref. N. Holonyak Jr. and S. F. Bevacqua, "Coherent (Visible) Light Emission from Ga(As1–xPx) Junctions," Appl. Phys. Lett., vol. 1, pp. 82-83, 1962.). Over the last four decades significant improvements in LED technology, availability of other semiconductor materials, and, generally, optoelectronic technology have led to more efficient devices being produced over a wider spectrum of visible color.

The illumination produced by LEDs is generated by radiative recombination of electrons and holes in a semiconductor device, generating light (photons) through the process of electroluminescence. In doped semiconductor material, impurity atoms change the electron balance, either adding free electrons or creating holes where electrons can migrate. Either of these additions makes the material more conductive. A semiconductor with extra electrons in the conduction band is called n-type material; free electrons move in the conduction energy band through the processes of diffusion and drift. A semiconductor with extra holes is called p-type material, since it has extra valence electron deficiencies (holes); the holes move in the valence energy band as positive charges through the processes of diffusion and drift. A heterostructure LED comprises a section of n-type material and a section of p-type material with an active layer in between, sometimes quantum sized, and with electrodes disposed in electrical communication with the n and p sections.

Light is produced by double heterostructure and "quantum well" LEDs when free electrons from the n-type layer recombine in the active layer with holes from the p-type layer. For every electron that falls from the conduction band to the valence band, there is a possibility of producing one photon, resulting in the illumination. The probability that a photon will be produced by recombination of a given electron is the internal quantum efficiency of the material. Visible light is only produced when the diode is composed of certain materials, so called "wide bandgap" materials, with a direct energy gap in the range of visible light. Until recently, it was not possible to use LEDs for general lighting applications, because general "white" lighting requires a blending of photons with several different energies, e.g. red, green, and blue, and the technology did not exist to make bright blue emitters.

Modern innovations in LED technology have led to the use of III-V semiconductor materials to produce high-efficiency LEDs at both ends of the visible spectrum. For example, III-arsenide-phosphide (III-AsP) materials have been used since the 1960s to produce yellow to infrared LEDs, and III-nitride (III-N) materials have been used since the mid-1990s to produce blue-green to ultraviolet LEDs. [Ref: Shuji Nakamura and Gerhard Fasol, *The Blue Laser Diode*, Springer, Berlin (1997)] The most efficient LEDs are made from double heterostructures, with an extremely thin "quantum sized" layer of light emitting alloy sandwiched between larger-bandgap and thicker p-type and n-type layers. The active layer in such devices is commonly referred to as the "quantum well" and is strictly defined as a one-dimensional (ID) potential well for electrons and holes whose width is of order the same or thinner than the free-exciton Bohr radius. In a true quantum well, electrons from the n-type layer and holes from the p-type layer exhibit ID confinement, being localized in the quantum dimension, and forming essentially 2-dimensional (2D) wavefunctions in the quantum well.

III-AsP device heterostructures are typically grown epitaxially on high quality bulk III-V substrates (e.g. GaAs) and the crystal quality in the active layers is very good, with on the order of 1000 crystal dislocations per square centimeter (cm) or less. As such, in III-AsP devices the electron-hole wavefunctions are truly 1D confined, as previously discussed. FIG. 1 provides a cross-sectional view of a III-AsP optoelectronic device, in accordance with the prior art. The device 10 includes a substrate 12 that is formed of gallium arsenide (GaAs), a n-type conductive layer 14 that is formed of n-type aluminum indium gallium phosphide (AlInGaP), a quantum well or active layer 16 that is formed of indium gallium phosphide (InGaP) and a p-type conductive layer 18 that is formed of p-type AlInGaP. This device is exemplary of a red LED heterostructure with ID confinement.

III-Nitride (III-N) device heterostructures are typically grown on sapphire or silicon carbide (SiC) substrates. Due to lattice and thermal conductivity mismatch between the substrate and the III-Nitride, the crystal structure in the active layer is low quality, exhibiting up to $10^9$ dislocations per square cm. FIG. 2 provides a cross-sectional view of a III-N optoelectronic device, in accordance with the prior art. The device 20 includes substrate 22 that is formed of sapphire, n-type conductive layer 24 that is formed of n-type gallium nitride (GaN), quantum well or active layer 26 that is formed of indium gallium nitride (InGaN) and includes high-indium-fraction InGaN quantum dots 28, and p-type conductive layer 30 that is formed of p-type GaN. Quantum-sized indium-rich dots, or nanoparticles, form spontaneously in InGaN quantum well layers grown with metal-organic chemical vapor deposition (MOCVD). [Ref: K. P. O'Donnell, R. W. Martin, and P. G. Middleton, Phys Rev Let, 82, 237 (1999)] Since the solubility of indium in InGaN is a function of the thermodynamic state of the InGaN, quantum dot formation in InGaN active layers is driven by the variations in thermodynamic state during the MOCVD process. The quantum dot formation process can now be empirically controlled to yield efficient light emitting diode wavelengths over a range from about 380 nanometers (nm) to about 520 nm. For wavelengths shorter than 380 nm, the relative lack of indium in the InGaN alloy does not allow for efficient light emitting devices and beyond 520 nm the InGaN nanostructure does not result in efficient device performance.

In the III-Nitride optoelectronic device illustrated in FIG. 2, if the electron-hole wavefunctions were simply confined in the quantum well as in III-AsP devices, then the III-N devices would not be very efficient because the 2D electron and hole wavefunctions would simultaneously intersect all the crystal dislocations 32 that act as non-radiative electron-hole recombination centers (NRRC) for electrons and holes. However, the InGaN active layer 26 exhibits strong InN—GaN material segregation because the layer consists of high-indium fraction InGaN quantum dots 28 in a low-indium fraction InGaN quantum well. Electron-hole pairs are confined in three-dimensions to the smaller bandgap higher-indium InGaN quantum dots and thus do not interact with the crystal dislocations. Both compositional and quantum-size effects provide for the quantum dots to illuminate visible blue light. Thus, it is possible to make high efficiency blue InGaN LED devices in spite of the high crystal dislocation densities.

FIG. 3 provides a cross-sectional view of a III-N optoelectronic device that exhibits epitaxial lateral overgrowth (ELOG), in accordance with the prior art. The ELOG process results in significantly lower threading dislocation density. The device 40 includes a substrate 42 that is formed of sapphire, n-type conductive layer 44 that is formed of n-type gallium nitride (GaN) and includes rows of silicon dioxide ($SiO_2$) stripes 46. The stripes serve to stop the dislocations 48 emanating from the substrate before they propagate into the active layer. Thus, the stripes tend to filter the dislocations and inhibit epitaxial lateral overgrowth of the conductive layer. The device additionally includes quantum well or active layer 50 that is formed of indium gallium nitride (InGaN) and includes high-indium-fraction InGaN quantum dots 52 and p-type conductive layer 54 that is formed of p-type GaN. This structure yields an even more efficient blue InGaN LED device then the example provided in FIG. 2.

While III-AsP and III-Nitride are good materials for high-efficiency red and blue LEDs and laser diodes, neither provides for high-efficiency deep green devices; i.e. devices that operate in the 555-585 nanometer range near the peak of the human eye response curve. [Ref: FIG. 6 in A. Bergh, G. Craford, A. Duggal, and R. Haitz, Physics Today, December 2001, p. 54] In this spectral region, recently commercialized cadmium selenide (CdSe) quantum dots may provide some illumination entitlement. Recently, significant developments have been made in the deposition of thin layers of CdSe quantum dots onto solid surfaces, assembly of the dots into 3-dimensional "quantum dot solids" and incorporation into prototype microelectronic devices. For example, CdSe nanoparticles dispersed in a polymer host matrix have been used as a downconverting layer over a blue or ultraviolet LED, see U.S. Pat. No. 6,501,091, entitled "Quantum Dot White and Colored Light Emitting Diodes", issued in the name of inventors Bawendi et al., on Dec. 31, 2002. Such quantum dot phosphor dispersions have the property of low optical scattering, since their size is significantly smaller than the wavelength of light. CdSe quantum dots have also been shown to be dispersible in an inorganic matrix. See, for example, published U.S. patent application Ser. No. 2003/0142944, published in the name of inventors Sundar et al., on Jul. 31, 2003. In addition, monolayers of CdSe quantum dots have been used as the active layer of organic LEDs with a 25 percent improvement over previous QD-LED performance and external quantum efficiency of 0.4 percent. [Ref: Coe et al, Nature, 420, 800 (2002)]

Hence, a need exists to develop and manufacture optoelectronic devices, such as LEDs, laser diodes and photodetectors that operate efficiently. In addition, a need exists to extend the wavelengths of light emitting diodes into the "deep green" range wavelengths near the peak of the human eye response curve, i.e. about 555 nm to about 585 nm. Such devices and the corresponding methods for producing such devices should be cost-effective and reliable. In addition, the desired devices should accommodate non-lattice matched substrates without having dislocations in the substrates adversely affect the performance of the devices.

BRIEF SUMMARY OF THE INVENTION

The present invention provides for optoelectronic devices that incorporate quantum dots as the electroluminescent layer in an inorganic wide-bandgap double heterostructure. Examples of such devices include quantum dot light emitting diodes (QD-LED), laser diodes, photodetectors and the like. The quantum dots serve as the optically active component of the device and, in multilayer quantum dot embodiments, facilitate nanoscale epitaxial lateral overgrowth (NELO) in heterostructures having non-lattice matched substrates. The quantum dots in such devices will be electrically pumped and exhibit electroluminescence, as opposed to being optically pumped and exhibiting photoluminescence. There is no inherent "Stokes loss" in electroluminescence, thus the devices of the present invention have higher efficiency entitlement than optically pumped quantum dot devices. Devices resulting from the present invention are capable of providing deep green visible light, as well as, any other color in the visible spectrum, including white light by blending the size of the dots and controlling manufacturing processes. In addition to the devices, the present invention also provides for novel means of manufacturing optoelectronic devices that incorporate quantum dots.

In the present invention the semiconductor quantum dots are disposed between two semiconductor electrodes, where the electrode bandgap is larger than that of the dots themselves, thus facilitating (1) direct electrical excitation of the quantum dots, potentially eliminating "Stokes losses" and (2) recombination of electron-hole pairs in a quantum confined environment, maximizing quantum efficiency. The present invention is superior to placing quantum dots on top of an LED, because such an optically excited approach results in "Stokes loss" every time a photon is downconverted. The present invention is also superior to placing the quantum dots between organic electrodes because organic electrodes are fundamentally less stable than the inorganic semiconductor electrodes proposed in the present invention.

In one embodiment of the invention a quantum dot optoelectronic device is defined that includes, a layer of a first conductive type, a quantum dot layer disposed on only a portion of the first layer such that other portions of the first layer remain uncovered by the quantum dot layer, and a second layer of second conductive type that is different from the first conductive type disposed on the quantum dot layer and the first layer. The device will typically include a substrate having the layer of first conductive type disposed on the substrate. However, in some embodiments the substrate may be removed after processing. The substrate may be formed of any suitable semiconductor or electrical insulator material, including sapphire, silicon, silicon dioxide, glass silicon carbide, lithium niobate, lithium gallate, gallium nitride, aluminum nitride, aluminum gallium nitride, zinc oxide or the like. Additionally, the device may include an encapsulation layer disposed over the quantum dot layer and under the second layer.

The first and second layers are typically formed of semiconductor materials having a bandgap wider than the bandgap of the quantum dots. In one embodiment the first and second layers are formed from a III nitride conductive type material, such as n-type or p-type gallium nitride. The optional encapsulation layer is typically formed of a non-conductive insulator material, typically the non-conductive version of the material used to form the first and second layers.

The quantum dot layer is typically a monolayer of quantum dots, although in alternate embodiments multiple layers of quantum dots may be implemented. The quantum dot layer is formed of a material chosen from the II-VI group semiconductor compounds. In one embodiment of the invention the quantum dot layer is formed of quantum dots having an inner core of a first II-VI group semiconductor compound and an outer core of a second II-VI group semiconductor compound, such as an inner core of cadmium selenide (CdSe) and an outer core of zinc sulfide (ZnS). Such CdSe core ZnS shell quantum dots with size 2-6 nm can be used to provide colors throughout the visible spectrum, while dots of varying sizes may be blended to provide for white light. The quantum dots may be patterned on the first layer or otherwise prearranged to provide nucleation sites for the second layer and to inhibit nanoscale epitaxial lateral overgrowth.

In an alternate embodiment, a quantum dot optoelectronic device is defined. The device includes a first layer of a first conductive type having a pitted surface, a plurality of quantum dots disposed on the pitted surface of the first layer such that the quantum dots are generally located proximate pit openings in the surface of the first layer and a second layer of a second conductive type that is different from the first layer disposed on the quantum dots and on the first layer. The device will typically include a substrate having the layer of first conductive type disposed on the substrate. However, in some embodiments the substrate may be removed after processing. The substrate may be formed of any suitable semiconductor or electrical insulator material, including sapphire, silicon, silicon dioxide, glass silicon carbide, lithium niobate, lithium gallate, gallium nitride, aluminum nitride, aluminum gallium nitride, zinc oxide or the like. The device will typically further include an encapsulation layer disposed between the plurality of quantum dots and the second layer.

The first and second layers are typically formed of semiconductor materials having a bandgap wider than the bandgap of the quantum dots. In one embodiment the first and second layers are formed from a III nitride material, such as n-type or p-type gallium nitride. The pits in the surface of the first conductive type layer may be etch pits or any other type of pits, cavities or pores formed in the surface of the layer. The pit locations may be correlated with the locations of threading dislocations. The pits may also include field emitter structures that serve to provide cathode luminescence to the device.

The plurality of quantum dots may be made to migrate toward the pit openings when disposed on the surface of the first conductive type layer. As such, the quantum dots may be defined as being proximate the pit openings. Similar to the previous embodiments, the plurality of quantum dots is formed of a material chosen from the II-VI group semiconductor compounds. In one specific embodiment the plurality of quantum dots will be formed of an inner core of II-VI group semiconductor compound and an outer shell of another II-VI group compound. The dot size will dictate the emission wavelength and, thus, the color of the light emitted. Embodiments having quantum dots of varying size will emit white light.

In another embodiment of the invention a method for making a quantum dot optoelectronic device is defined. The method includes the steps of disposing a first layer of a first conductive type on a substrate, disposing a quantum dot layer on only a portion of the first layer such that other portions of the first layer remain uncovered by the quantum dot layer, and disposing a second layer of a second conductive type that is different from the first type on the quantum dot layer and the first layer. Additionally, the method may include the step of disposing an encapsulation layer between the quantum dot layer and the second layer.

Disposing the first layer may entail growing a first conductive type layer by metal-oxide chemical vapor deposition (MOCVD). Higher temperature and therefore more rapid processes can be implemented at this stage because the quantum dots have not yet been deposited. The quantum dots may be disposed in solution or slurry form, such as by drop-cast or spin-coat processing. Additionally, the quantum dots may be disposed by chemically attaching (i.e., self-assembled MOCVD or MBE processes) the quantum dot layer to the n-type semiconductor material layer. It is also possible to dispose the quantum dots in a porous solid-matrix, such as a sol-gel matrix.

Once the quantum dots have been disposed, subsequent processing is performed at a lower temperature to preserve the stability of the quantum dots. For example, the encapsulation layer may be disposed by growing the layer by molecular beam epitaxy at or below 500 degrees Celsius. Additionally, the second layer may be grown by MBE or by Organo Metallic Vapor Phase Epitaxy (OMVPE).

An additional embodiment of the invention is defined by a method for making quantum dot optoelectronic devices. The method includes the step of disposing a first layer of a first conductive type on a substrate, providing for a plurality of pits in a surface of the first layer, disposing a plurality of quantum dots on the surface of the first layer such that the quantum dots are generally located proximate the plurality of pits in the surface of the first layer and disposing a second layer of a second conductive type that is different from the first conductive type on the plurality of quantum dots and the first layer. The pits provided in the first conductive type layer can be formed by wet etch processing or any other suitable semiconductor processing technique.

Thus, the present invention provides for optoelectronic devices that incorporate quantum dots as the electroluminescent layer in an inorganic wide-bandgap heterostructure. The quantum dots serve as the optically active component of the device and, in multilayer quantum dot embodiments, facilitate nanoscale epitaxial lateral overgrowth (NELOG) in heterostructures having non-lattice matched substrates. The quantum dots in such devices will be electrically pumped and exhibit electroluminescence, as opposed to being optically pumped and exhibiting photoluminescence. There is no inherent "Stokes loss" in electroluminescence thus the devices of the present invention have higher efficiency than optically pumped quantum dot devices. Devices resulting from the present invention are capable of providing deep green visible light, as well as, any other color in the visible spectrum, including white light by blending the size of the dots and controlling manufacturing processes.

BRIEF DESCRIPTION OF THE DRAWINGS

Figure 1:
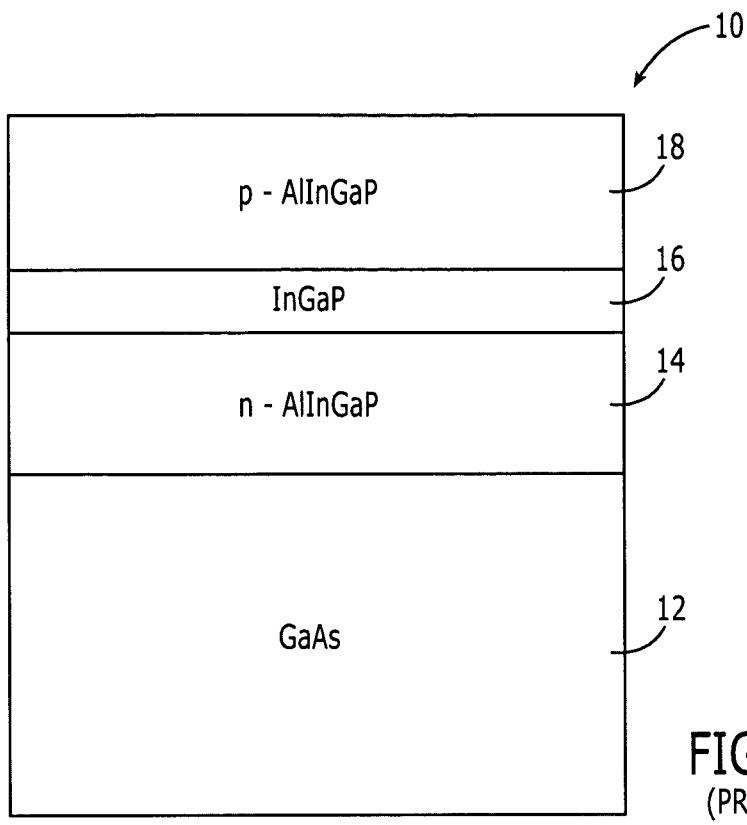

Having thus described the invention in general terms, reference will now be made to the accompanying drawings, which are not necessarily drawn to scale, and wherein:

FIG. 1 is cross-sectional view of a III-AsP heterostructure, optoelectronic device, in accordance with the prior art.

Figure 2:
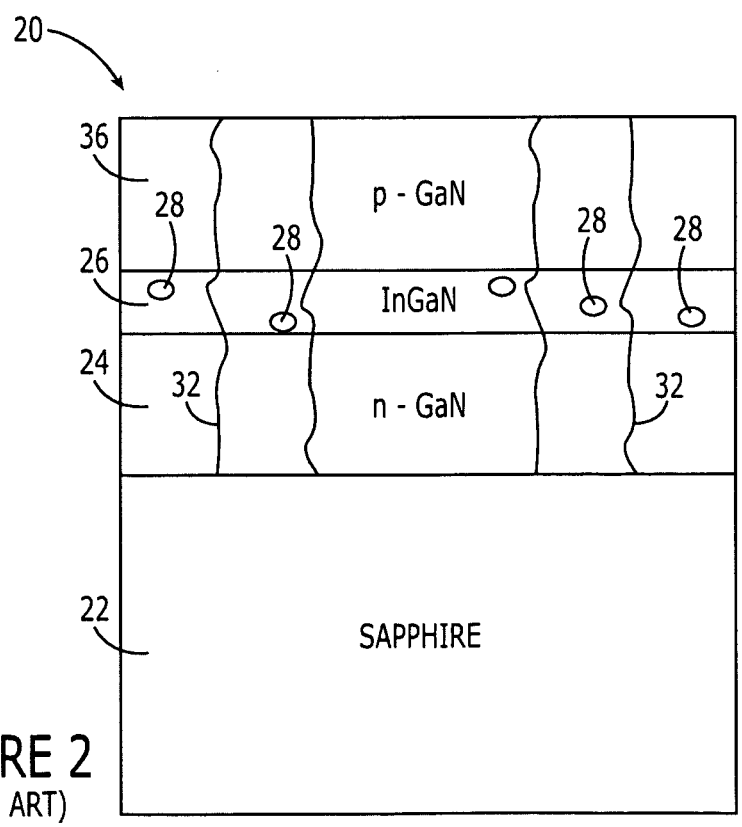

FIG. 2 is a cross-sectional view of a III-N heterostructure, optoelectronic device incorporating quantum dots in the active region, in accordance with the prior art.

Figure 3:
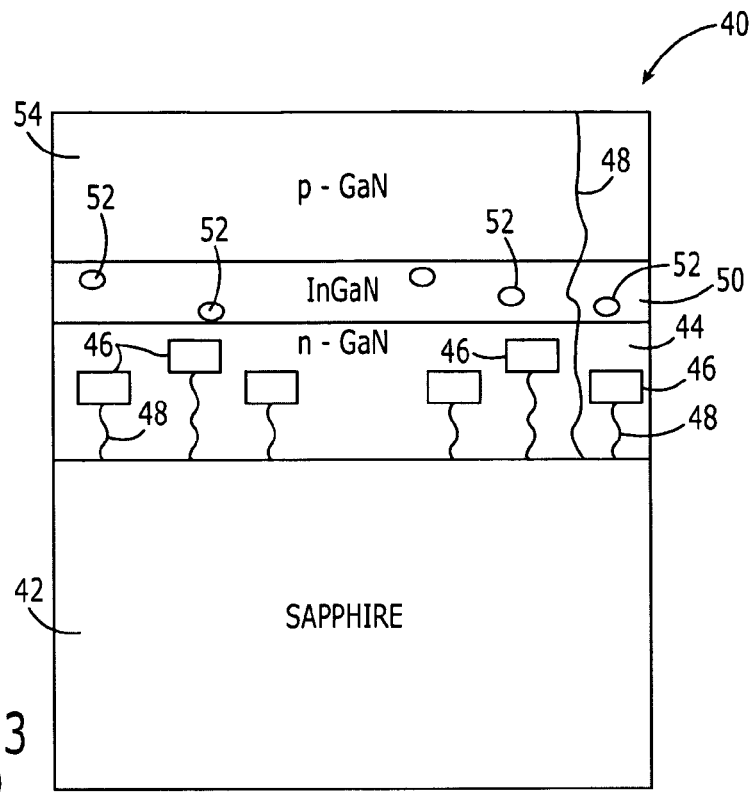

FIG. 3 is a cross-sectional view of a III-N heterostructure, optoelectronic device having quantum dots as the active region and dislocation blocking mechanisms in the first conductive layer, in accordance with the prior art.

Figure 4:
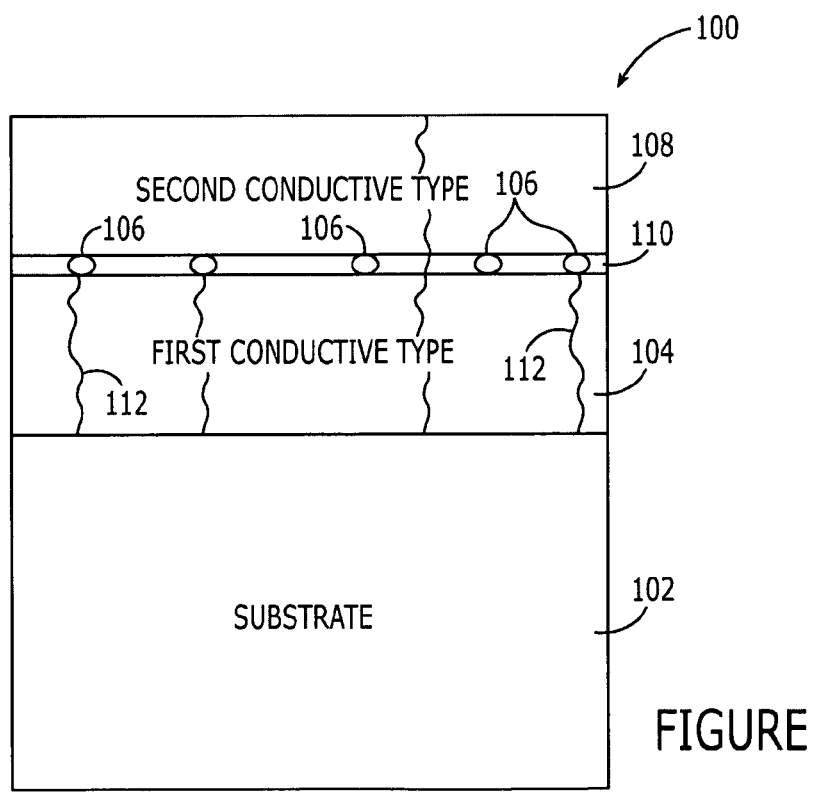

FIG. 4 is a cross-sectional view of an optoelectronic device having a quantum dot layer as the active region, in accordance with an embodiment of the present invention.

Figure 5:
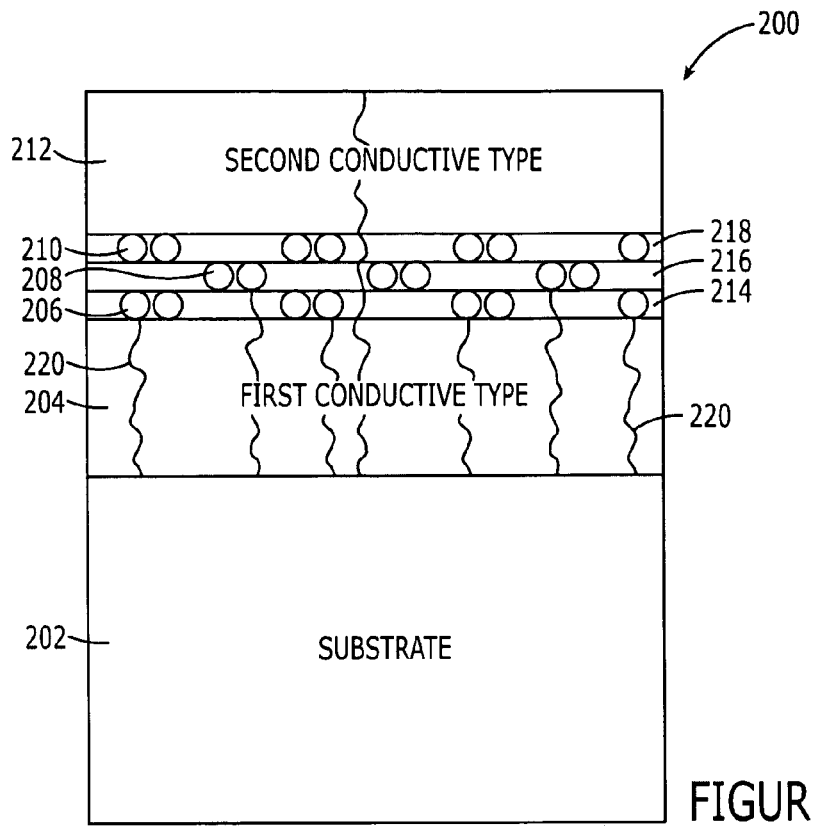

FIG. 5 is a cross-sectional view of an optoelectronic device having multiple quantum dot layers as the active region, in accordance with an embodiment of the present invention.

Figure 6:
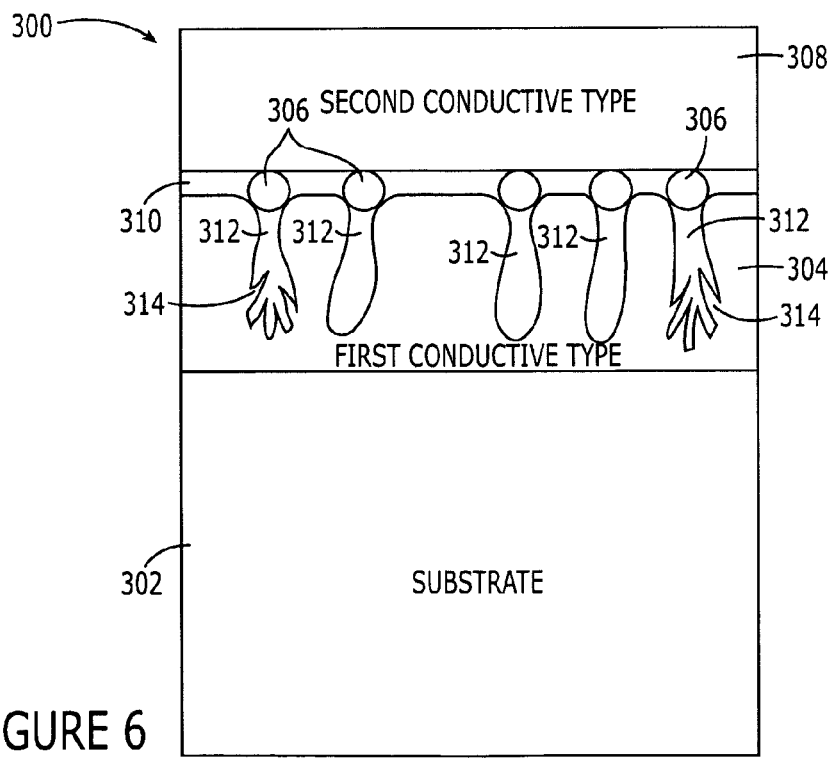

FIG. 6 is a cross-sectional view of an optoelectronic device having quantum dots in the active region that are located proximate the openings of pits in the surface of the first conductive type layer, in accordance with an embodiment of the present invention.

FIGS. 7A-7E are cross-sectional views of various stages in the method for making optoelectronic devices having quantum dots as the active region, in accordance with an embodiment of the present invention.

FIGS. 8A-8E are cross-sectional views of various stages in an alternate method for making optoelectronic devices having quantum dots as the active region, in accordance with an embodiment of the present invention.

Figure 9:
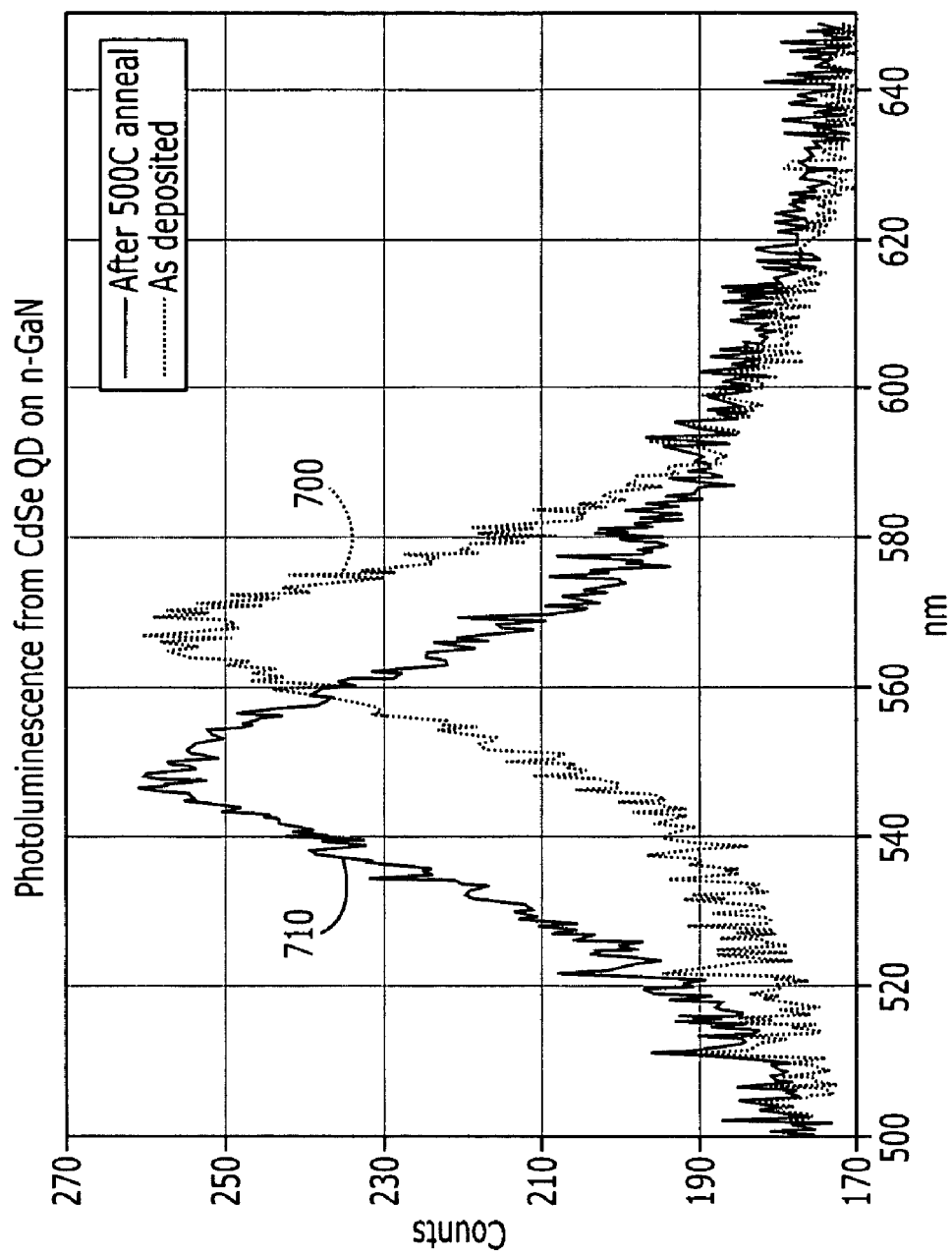

FIG. 9 is a graph of the photoluminescence provided by CdSe QDs on n-GaN device, in accordance with an embodiment of the present invention.

DETAILED DESCRIPTION OF THE INVENTION

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The present invention provides for optoelectronic devices that incorporate quantum dots as the electroluminescent layer in an inorganic wide-bandgap heterostructure. Examples of such devices include quantum dot light emitting diodes (QD-LED), laser diodes, photodetectors and the like. The quantum dots serve as the optically active component of the device and, in multilayer quantum dot embodiments, facilitate nanoscale epitaxial lateral overgrowth (NELOG) in heterostructures having non-lattice matched substrates. The quantum dots in such devices will be electrically pumped and exhibit electroluminescence, as opposed to being optically pumped and exhibiting photoluminescence. There is no inherent "Stokes loss" in electroluminescence thus the devices of the present invention have higher efficiency than optically pumped quantum dot devices. Devices resulting from the present invention are capable of providing deep green visible light, as well as, any other color in the visible spectrum, including white light by blending the size of the dots and controlling manufacturing processes. In addition to the devices, the present invention also provides for novel means of manufacturing optoelectronic devices that incorporate quantum dots.

FIG. 4 provides a cross-sectional view of an optoelectronic device incorporating quantum dots, in accordance with an embodiment of the present invention. The device 100 includes a substrate 102, a first conductive layer 104 of a first conductive type, a quantum dot layer 106 and a second layer 108 of a second conductive type that differs in conductivity from the first layer. In addition, the device will typically include an encapsulation layer 110 that encapsulates the quantum dot layer.

The substrate 102 may be formed of any suitable semiconductor material, for example the substrate may be formed of sapphire, silicon carbide or the like. The substrate should generally be optically transparent to the light that will be generated by the active QD layers, although this is not absolutely required, since a reflector (e.g. discrete Bragg reflector, DBR) can in principle be incorporated between substrate and device heterostructures to reflect light away from a non-transparent, and hence absorbing, substrate. The substrate should be thick enough so as to be mechanically stable through the growth process. For GaN epitaxial growth with MOCVD, a typical substrate is a commercial sapphire wafer with about 250 micrometers of thickness. Typically, after LED device heterostructures are grown and LED devices are fabricated, the sapphire substrate is thinned down to about 75 micrometers.

The first layer 104 is disposed on the substrate 102. It is noted that the term "disposed on" does not necessarily require that the layer or element be formed directly on the underlying, overlying or adjacent layer or element and, as such, intermediary layers may exist. The first layer will comprise an n-type conductive layer or a p-type conductive layer as dictated by the design of the device. The first layer will typically comprise a transparent material having a wide-bandgap, further defined as having a band-gap wider than the bandgap of the quantum dots. Wide-bandgap materials will ensure low absorbance for light emitting devices, and also insure that electron and holes remain confined in the active layer to enhance radiative efficiency. For example, the first conductive layer may comprise a III-nitride semiconductor material, such as gallium nitride (GaN), zinc sulfide (ZnS), zinc selenide (ZnSe), cadmium sulfide (CdS), zinc oxide (ZnO), magnesium oxide (MgO) and the like. In one embodiment of the invention the substrate will comprise sapphire and the first conductive type layer will comprise GaN, either p-type GaN or n-type GaN. The thickness of the first layer should be sufficient to allow low-loss current spreading to the entire active layer in the resulting LED device. For example, about 3 to about 5 micrometers of n-GaN is typically a sufficient thickness in commercial InGaN LED heterostructure LEDs. The actual optimum thickness depends on the conductivity of the material used.

In alternate embodiments of the invention, the substrate 102 may be removed after processing, typically after the first layer 104 has been grown on the substrate. For example, a thick layer of Halide Vapor Phase Epitaxy (HVPE) GaN may be grown on a sapphire substrate and the substrate may be subsequently removed by a lift-off process, such as a laser lift-off process. After the substrate 102 is removed, the first layer 104 may be referred to as the device's "substrate". Thus, in the example presented, the resulting device may be referred to as having a "GaN substrate".

The quantum dot layer 106, which may be characterized as a monolayer or a multilayer, is disposed on only a portion of the first layer 104 such that other portions of the first layer remain uncovered by the quantum dot layer. Partial surface coverage by the quantum dot layer provides nucleation sites for subsequently disposed second layer nucleation and for epitaxial lateral overgrowth. Preferentially, the quantum dots may be located proximate threading dislocations 112 in the first conductive type layer. In instances in which the quantum dots are located proximate the threading dislocations crystal quality may be improved after nanometer-scale epitaxial overgrowth since the quantum dots essentially stop further propagation of the threading dislocations into the second layer. A predetermined percent of surface coverage and a predetermined surface pattern of quantum dots will typically be chosen to optimize the electroluminescence attained from resulting devices. For example, in one particular embodiment the quantum dot layer will result in cluster-like formations of quantum dots with each cluster ranging from individual quantum dot size (a few nanometers) to a few micrometers, with spacing in the same range, and with 5 to 95% surface coverage.

The quantum dots 106 are typically formed of a II-VI group semiconductor compound; such as cadmium selenide (CdSe), cadmium telluride (CdTe), zinc sulfide (ZnS), zinc selenide (ZnSe) or the like. In one specific embodiment of the invention, the quantum dots are comprised of an inner core and another core, both of which may be formed of different II-VI group materials. For example, CdSe may form the inner core of the quantum dots and ZnS may form an outer core of the quantum dots. The outer core serves to stabilize the quantum dots for certain applications. The size of the quantum dots will dictate the color of the luminescence provided by the dots. For example, CdSe/ZnS core-shell quantum dots having a size in the range of about 3 nm to about 4 nm will emit in the green (i.e., emission wavelengths in the range of about 555 nanometers to about 585 nanometers), while other uniform sized quantum dots will provide red and blue luminescence. A blended formulation of quantum dots of varying size will provide for white luminescence.

The optoelectronic device 100 of the present invention will typically incorporate an encapsulation layer 110 disposed on or about the quantum dot layer 106 and the exposed portions of the first layer 104. The encapsulation layer will typically be formed of a non-conductive, insulating material and in most embodiments the encapsulation layer will be formed of the non-conductive host material that is common to the first and second layers. For example, in embodiments in which the first layer is formed of p-type or n-type GaN, the encapsulation layer may be formed of non-conductive GaN. The encapsulation layer will typically be a thin layer, in the range of about 1 nm to about 100 nm, which serves to encapsulate the quantum dots. The purpose of the encapsulation layer is to mechanically stabilize the QDs for subsequent process steps, and also to prevent current paths that do not flow through the QDs. In this case, there is not a true quantum well in the GaAsP sense, but rather a distribution of e.g. CdSe quantum dots in a matrix of wider band-gap e.g. i-GaN material. In principle, it should be possible to encapsulate the quantum dots by formation of the second layer 108, as such, in those embodiments a separate encapsulation layer would not be required. In the case of CdSe QD between n-GaN and p-GaN layers, this approach should work, since the resulting structure is still a distribution of e.g. CdSe QD in a matrix of wider bandgap material, e.g. between p-GaN and n-GaN. The second layer 108 will be disposed on the quantum dot layer 106 and the first layer 104. In those embodiments in which the second layer serves as the quantum dot encapsulator, the second layer will generally be formed directly on the quantum dots and the exposed portions of the first layer. In those embodiments in which a separate encapsulation layer is provided, the second conductive layer will generally be formed directly on the encapsulation layer 110. It is noted that the second layer will differ in terms of conductivity from the first layer. For example, if the first layer is an n-type layer, then the second layer is a p-type layer and vice versa.

Similar to the first layer, the second layer will typically comprise a transparent material having a wide-bandgap, further defined as having a band-gap wider than the quantum dots. For example, the second layer may comprise a III-nitride semiconductor material, such as gallium nitride (GaN), or gallium arsenide (GaAs), zinc sulfide (ZnS), zinc selenide (ZnSe) and the like. Typically, the second layer will be formed of the same host material as the first layer, differing only in the conductivity type. The second layer will typically be thick enough to allow sufficient current to spread in the resulting LED device structures. For example, in a commercial InGaN LED heterostructures, the second layer is p-GaN, and will typically have a thickness of about 0.1 to about 0.5 micrometers, and the thickness is limited by the current state-of-the-art of MOCVD technology for growing p-type GaN.

FIG. 5 is a cross-sectional view of an optoelectronic device incorporating multiple layers of quantum dots, in accordance with an embodiment of the present invention. Alternating patterns of quantum dot layers facilitate nanoscale epitaxial lateral overgrowth (NELOG) in heterostructures on non-lattice matched substrates. As shown the multiple quantum dot layer construct 200 includes a substrate 202, a first layer 204, a first quantum dot layer 206, a second quantum dot layer 208, a third quantum dot layer 210 and a second layer 212 of a different conductive type than the first layer. Additionally each of the quantum dot layers will typically be encapsulated with a corresponding first, second and third encapsulation layer 214, 216 and 218 prior to disposing the subsequent quantum dot layer on the second layer. Each of the quantum dot layers will be disposed on a portion of the underlying layer (i.e., the firs layer or a preceding quantum dot layer), so as to allow for nucleation sites to exist and for epitaxial lateral overgrowth. In the illustrated embodiment the substrate may comprise sapphire and the first layer may comprise a 111-N semiconductor material. Since these materials are not lattice matched, the dislocations are readily apparent. The multiple layers of quantum dots serve to block the dislocations 220 emanating from the substrate before they propagate into the second conductive type layer. Thus, the multiple quantum dot layers tend to filter the dislocations and facilitate epitaxial lateral overgrowth of the conductive layer.

FIG. 6 is a cross-sectional view of an optoelectronic device incorporating quantum dots and pits/pits in the first layer, in accordance with an alternate embodiment of the present invention. The device 300 includes a substrate 302, a first layer 304, a quantum dot layer 306 and a second layer 308 that differs in conductivity from the first layer. In addition, the device will typically include an encapsulation layer 310 that encapsulates the quantum dot layer. The first conductive type layer will be characterized by pits 312 formed or otherwise existing in the surface of the first conductive type layer upon which the quantum dots are disposed. Typically, the pits will be formed by an etch process, although other forms of surface pitting processes may also be employed. The pit openings in the surface of the first conductive layer will provide for areas where quantum dots will migrate upon deposition. As such the quantum dots will characteristically be proximate the pit openings in the surface of the first conductive type layer. Additionally, the pits 312 may include field emitter structures 314, sharp peaks extending outwardly from the interior walls of the pits. In such embodiments, application of a sufficient electrical voltage across the device will result in electroluminescence from the first conductive layer 304 in combination with cathode luminescence from the field emitters creating an overall robust and efficient optoelectronic device.

In accordance with another embodiment of the present invention, a method for making a quantum dot optoelectronic device is provided. The method includes the steps of disposing a first layer on a substrate, followed by, disposing a quantum dot layer on only a portion of the first layer and then disposing a second layer of a conductive type different from the layer on the quantum dot layer and the first conductive type layer. Partial coverage by the quantum dots allows for nucleation sites to exist for layer nucleation and for epitaxial lateral overgrowth. FIGS. 7A-7E depict cross-sectional views of various stages of the method for making quantum dot optoelectronic devices, in accordance with an embodiment of the present invention.

Figure 7A:
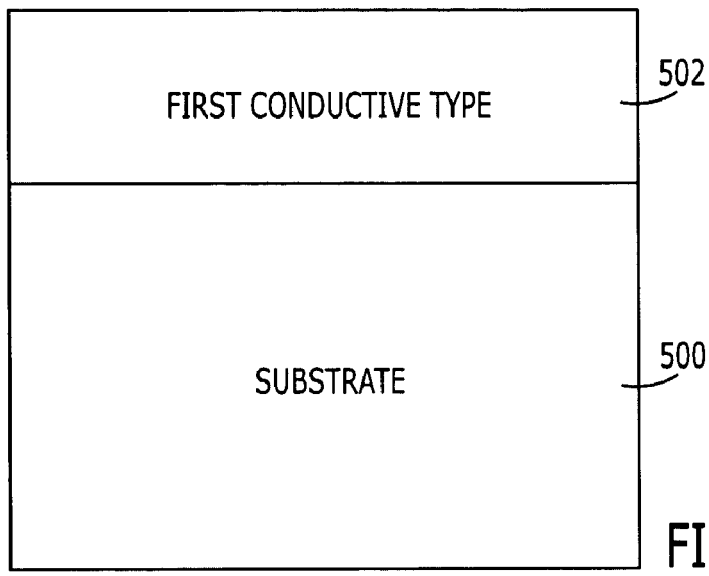

FIG. 7A illustrates a cross-sectional view of the first layer 502 having been disposed on the substrate 500. Typically, the first layer is grown on the substrate by conventional metal organic chemical vapor deposition (MOCVD) processing. Conventional MOCVD processing is typically performed at relatively high temperature, higher than 1000 degrees Celsius, which provides for fast, efficient growth. In one specific embodiment about 2 micrometers to about 10 micrometers of a first layer, such a n-type GaN is grown on a template substrate, such as sapphire. Epi-ready n-GaN on sapphire constructs are commercially available from numerous sources.

Figure 7B:
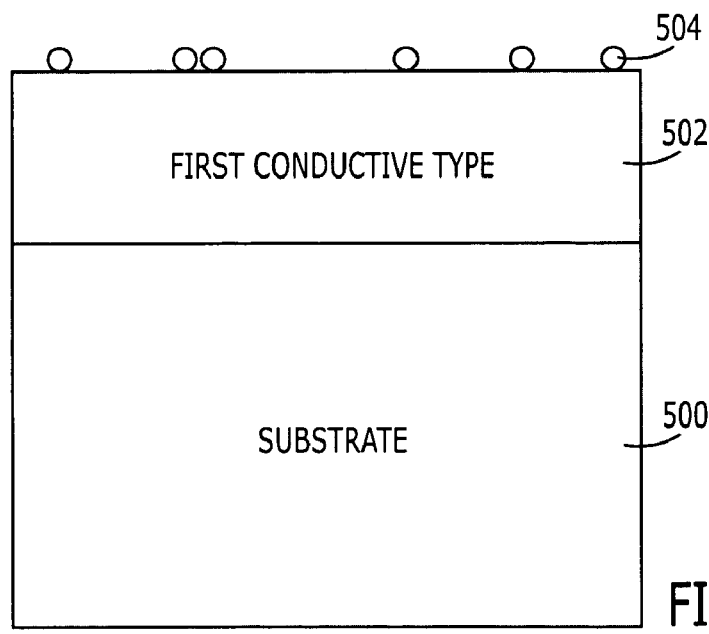

FIG. 7B illustrates a cross-sectional view of the quantum dot layer 504 having been disposed on a portion of the first layer 502 such that other portions of the first layer remain uncovered by the quantum dot layer. In accordance with the invention various processes may be performed to dispose the quantum dot layer on a portion of the first layer. Prior to quantum dot deposition it may be advisable to perform surface roughening with ion milling, MBE or preliminary chemical etching. Such roughening may define desired locations for quantum dots. For example, chemical etching is often used to reveal threading dislocations through preferential etching of disordered material. In addition, patterning and liftoff may be used to define the areas of quantum dot concentration and to insure adequate exposure of the first layer after dot deposition.

In one embodiment the quantum dot layer is disposed via spin-on or drop-cast processing in solution form, such as a solvent based solution. In one specific embodiment, toluene is used as the solvent and the quantum dots are CdSe-core/ZnS-shell in a concentration ranging from about 50 micrograms/milliliter to about 200 micrograms/milliliter. Solution parameters such as solvent polarity, vapor pressure and viscosity will be varied to optimize deposition and device performance. The structure is subsequently dried at low temperature to evaporate the solvent and solidify the location of the quantum dots on the surface of the first layer.

In an alternate embodiment the quantum dots may be disposed via spin-on or drop cast processing in slurry form, such as a slurry of toluene and alcohol. In another embodiment the quantum dots and the surface may be functionalized with chemically reactive groups, and the quantum dots chemically attached to the surface. Alternatively, in another embodiment the quantum dots may be deposited in a solid matrix such as porous sol-gel. The porous nature of the sol-gel material will allow for subsequent epitaxial lateral overgrowth.

Figure 7C:
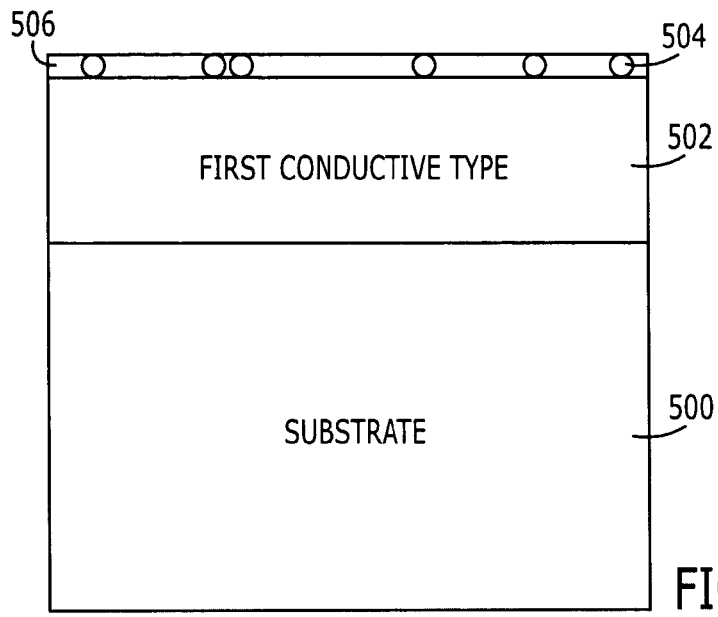

FIG. 7C is a cross-sectional view of the optoelectronic device construct after the optional encapsulation layer 506 has been formed on the quantum dot layer 504 and on the exposed areas of the first layer 502. The encapsulation layer is typically a thin layer of a non-conductive insulator, typically the non-conductive semiconductor material that serves as the host material for the first and second layers. The encapsulation layer may be formed by a low temperature molecular beam epitaxial (MBE) process or any other conventional low-temperature process may be used. Low temperature processing is essential to insure the stability of the quantum dots and to achieve a peak wavelength in the range of about 540 nm to about 580 nm (i.e., the dark green range).

Figure 7D:
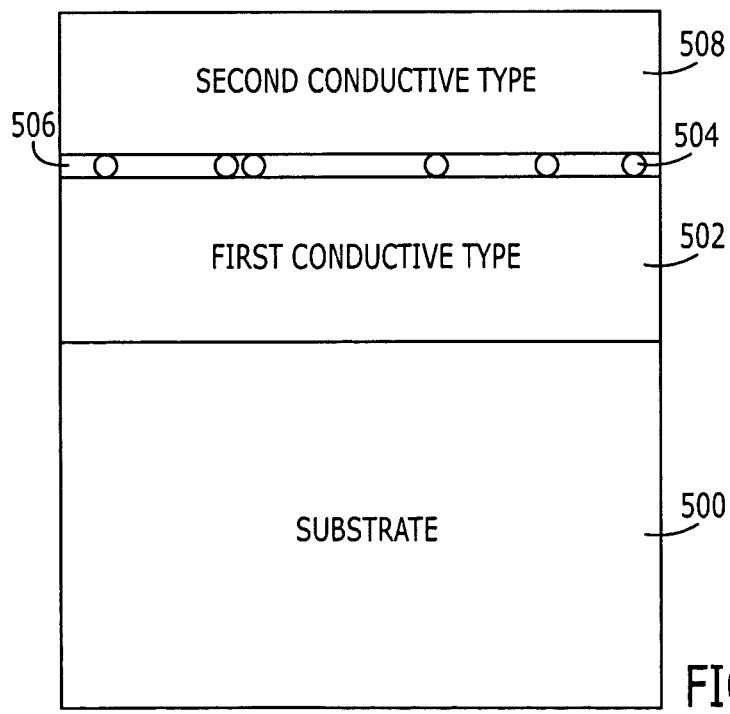
Figure 7E:
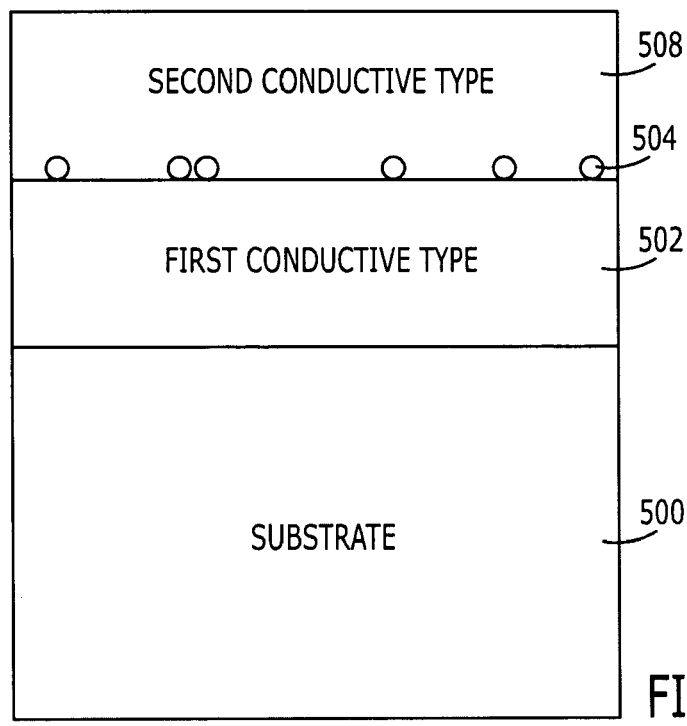

FIG. 7D is a cross-sectional view of the optoelectronic device construct in which the second layer 508 is formed on the encapsulation layer 506. The second layer is typically grown on the encapsulation layer by a conventional semiconductor process, such as organometallic vapor phase epitaxy (OMVPE) or MOCVD. The thickness of the second layer will typically be generally equivalent to the thickness of the first conductive layer, for example the thickness may range from about 200 nanometers to about 600 nanometers. FIG. 7E is a cross-sectional view of an alternate method in which the second layer 508 is formed on the quantum dot layer 504 and the first layer 502, absent the encapsulation layer. In this embodiment of the invention the second layer serves to encapsulate the quantum dots. The second conductive layer is typically deposited by a low-temperature process, such as low temperature MBE, to insure the stability of the quantum dots and to provide a device with the requisite peak emission wavelength.

Figure 8A:
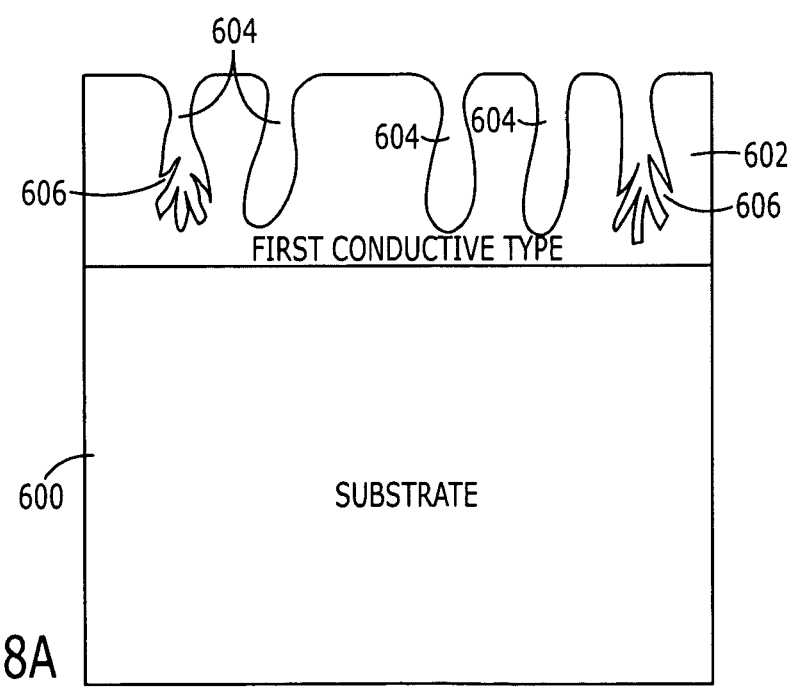

FIGS. 8A-8E depict cross-sectional views of various stages of an alternative method for making quantum dot optoelectronic devices, in accordance with an embodiment of the present invention. FIG. 8A illustrates a cross-sectional view of the first layer 602 having been disposed on the substrate 600 and after having pits 604, also referred to as pores or cavities, formed in the surface of the first conductive layer. Typically, the first conductive type layer is grown on the substrate by conventional MOCVD processing. In one specific embodiment about 2 micrometers to about 10 micrometers of a first layer, such as a doped silicon or doped silicon carbide (SiC) is grown on a template substrate, such as sapphire. The pits in the first layer are typically formed by a conventional wet etch process. Additionally, the pits may be formed by other conventional semiconductor processing techniques or the material itself may be porous. The pits may include field emitter structures 606 that emit electrons that impinge upon the quantum dots to provide cathode luminescence to the device.

Figure 8B:
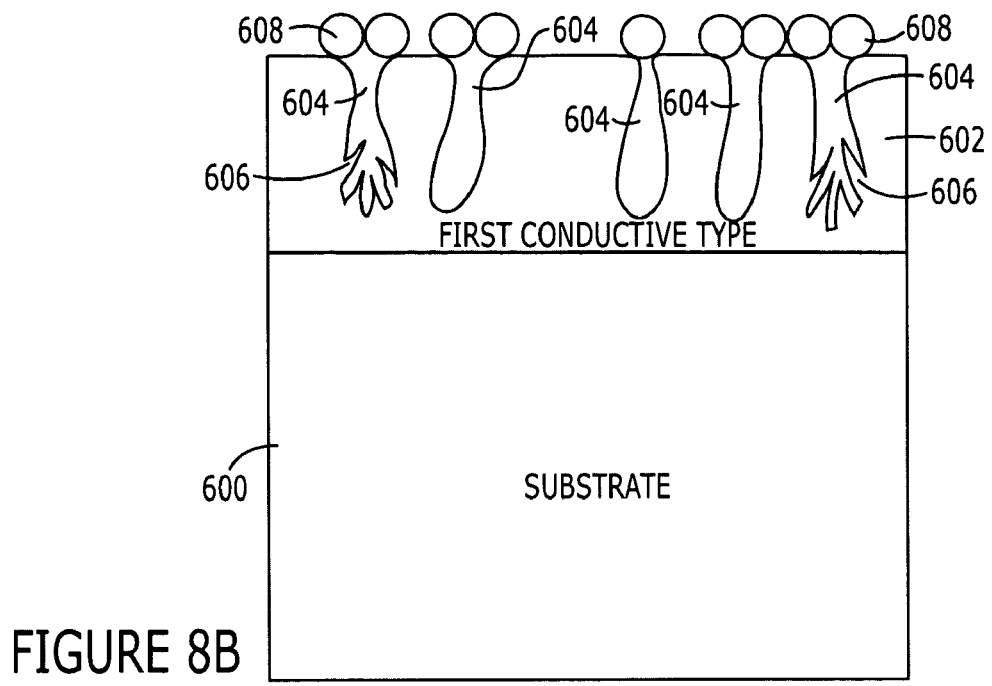

FIG. 8B illustrates a cross-sectional view of a plurality of quantum dots 608 having been disposed on he first layer 602 such that the quantum dots are located proximate openings of the pits. The pits on the surface of the first layer will create a generally uneven topography and the quantum dots will have a general tendency to migrate toward the lower surface levels. As such, the pit openings will generally provide for areas to which the quantum dots will migrate open disposal. In accordance with the invention, various processes may be performed to dispose the quantum dot layer on the first layer. In one embodiment the quantum dot layer is disposed via spin-on or drop-cast processing in solution form, such as a solvent based solution. In an alternate embodiment the quantum dots may be disposed via spin-on or drop cast processing in slurry form, such as a slurry of toluene and alcohol. In another embodiment the quantum dots may be functionalized and chemically attached to the surface. Alternatively, in another embodiment the quantum dots may be deposited in a solid matrix such as porous sol-gel. The porous nature of the sol-gel material will allow for subsequent epitaxial lateral overgrowth.

Figure 8C:
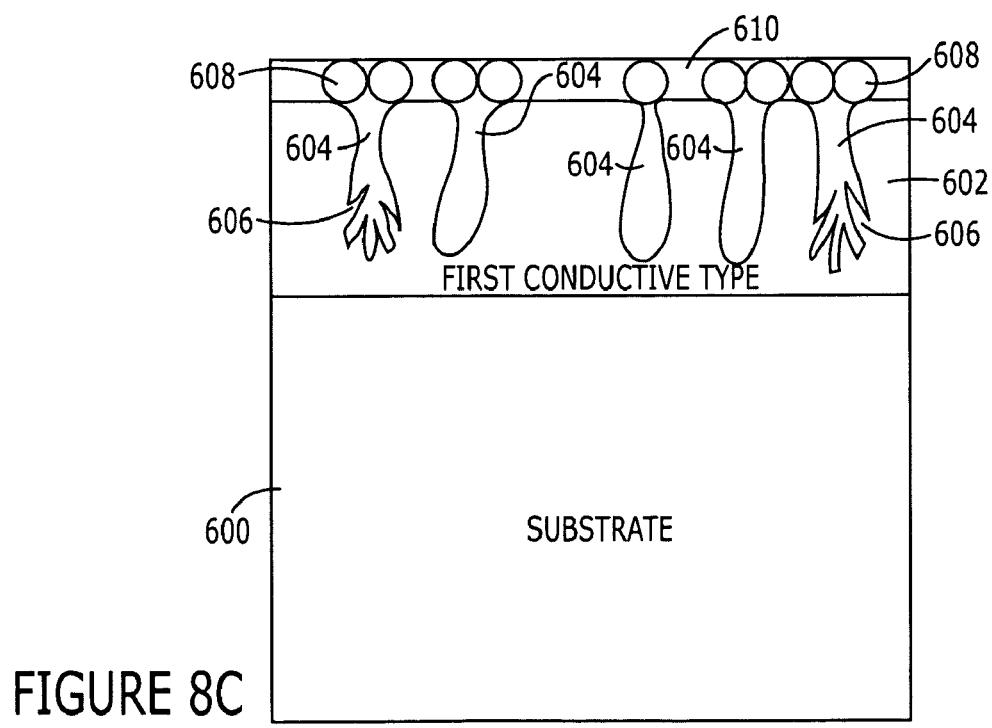

FIG. 8C is a cross-sectional view of the optoelectronic device construct after the optional encapsulation layer 610 has been formed about the plurality of quantum dots 608 and on the exposed areas of the first layer 602. The encapsulation layer is typically a thin layer of a non-conductive insulator, typically the non-conductive semiconductor material that serves as the host material of the first and second layers. The encapsulation layer may be formed by a low temperature MBE process or any other conventional low-temperature process may be used.

Figure 8D:
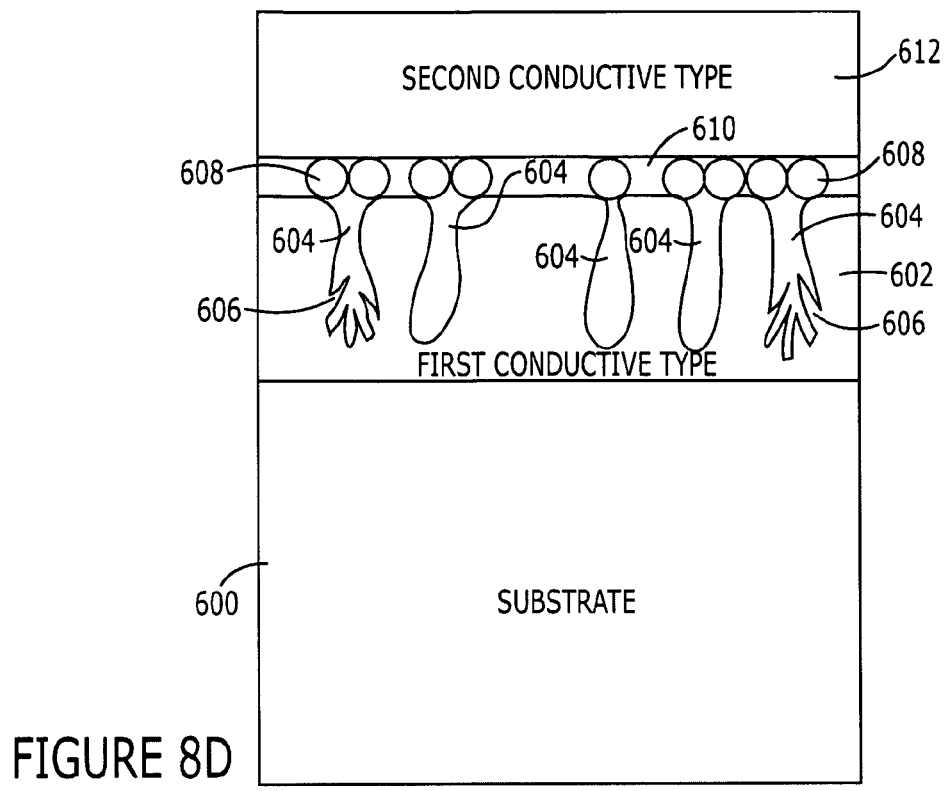
Figure 8E:
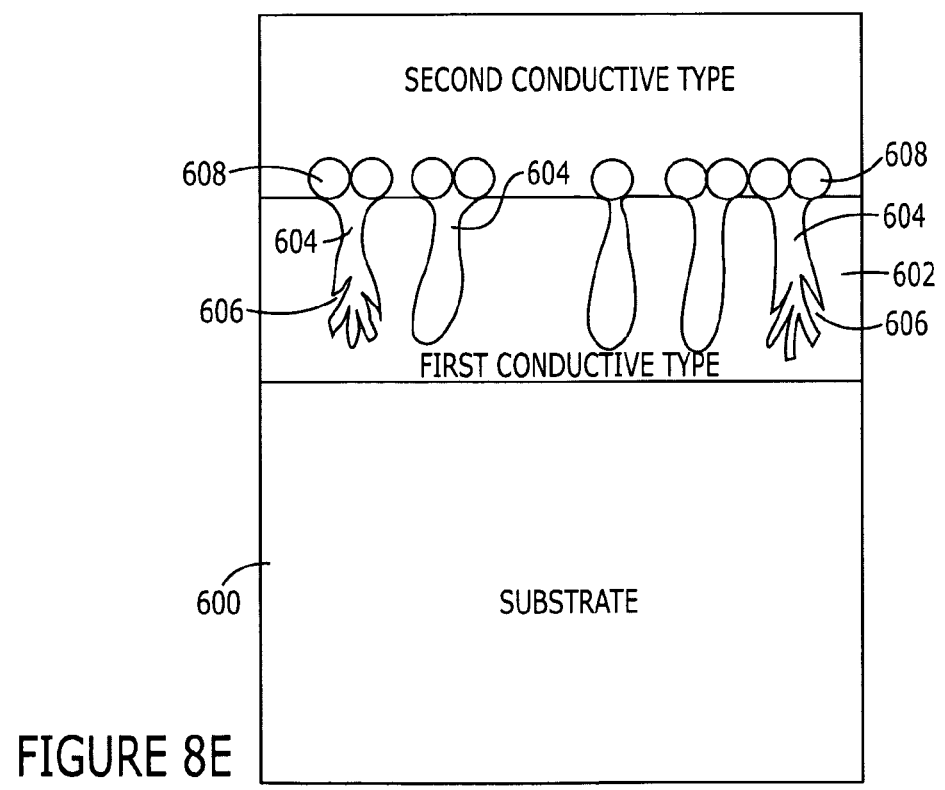

FIG. 8D is a cross-sectional view of the optoelectronic device construct in which the second layer 612 is formed on the encapsulation layer 610. The second layer is typically grown on the encapsulation layer by a conventional semiconductor process, such as organometallic vapor phase epitaxy (OMVPE) or MOCVD. The thickness of the second layer will typically be generally equivalent to the thickness of the first layer, for example the thickness may range from about 200 nanometers to about 600 nanometers. FIG. 8E is a cross-sectional view of an alternate method in which the second c layer 612 is formed on the plurality of quantum dots 608 and the first layer 602, absent the encapsulation layer. In this embodiment of the invention the second layer serves to encapsulate the quantum dots. The second layer is typically deposited by a low-temperature process, such as low temperature MBE, to insure the stability of the quantum dots and to provide a device with the requisite peak emission wavelength.

FIG. 9 provides a graphical representation of the photoluminescence of a test structure precursor of the present invention. The optoelectronic device includes a CdSe quantum dot layer disposed on n-type GaN conductive layer and a sapphire substrate. The quantum dots, about 5.4nm in diameter, have been drop cast on the n-type GaN layer via a solution of toluene and subsequently dried at 60 degrees Celsius. The first line 700 illustrates the photoluminescence exhibited by the device after the dots have been drop cast and before any further thermal treatment has occurred. The second line 702 illustrates the photoluminescence exhibited by the device after approximately 30 minutes in a MBE growth chamber at about 500 degrees Celsius. It is noted that the peak wavelength of the quantum dots is initially about 566 nm, and is shifted 20 nm to about 546 nm after the thermal treatment process. In order to achieve 566 nm after completion of the MBE process (i.e., after the second conductive type layer has been grown), larger diameter quantum dots may be used that have emission in the about 586 nm wavelength range.

Thus, the present invention provides for optoelectronic devices that incorporate quantum dots as the electroluminescent layer in an inorganic wide-bandgap heterostructure. The quantum dots serve as the optically active component of the device and, in multilayer quantum dot embodiments facilitate nanoscale epitaxial lateral overgrowth (NELOG) in heterostructures having non-lattice matched substrates. The quantum dots in such devices are electrically pumped and exhibit electroluminescence. There is no inherent "Stokes loss" in electroluminescence thus the devices of the present invention have higher efficiency than optically pumped quantum dot devices. Additionally, the devices resulting from the present invention are capable of providing deep green visible light, as well as, any other color in the visible spectrum, including white light.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A quantum dot optoelectronic device, comprising:
    a first layer of a first conductivity, an upper surface of the first layer including openings on dislocations in the first layer;
    a quantum dot layer directly on only a portion of the upper surface of the first layer such that quantum dots are in the openings and that other portions of the upper surface of the first layer remain uncovered by the quantum dot layer, sizes of the openings and the quantum dots being selected such that the openings trap the quantum dots, the dislocations extending down through the first layer below the quantum dots; and
    a second layer of a second conductivity that is different from the first conductivity directly on the quantum dot layer and on the other portions of the upper surface the first layer.

2. The device of claim 1, wherein the second layer is an encapsulation layer.

3. The device of claim 1, further comprising a substrate, the first layer being disposed on the substrate.

4. The device of claim 3, wherein the substrate is formed of a material chosen from the group of electrical insulators.

5. The device of claim 3, wherein the substrate is formed of a material chosen from the group of semiconductors.

6. The device of claim 3, wherein the substrate includes at least one of sapphire, silicon, silicon dioxide, glass, silicon carbide, lithium niobate, lithium gallate, gallium nitride, aluminum nitride, aluminum gallium nitride, and zinc oxide.

7. The device of claim 1, wherein the first and second layers are formed of semiconductor materials having a bandgap wider than the bandgap of the quantum dots.

8. The device of claim 1, wherein the first layer is comprised of a III nitride material.

9. The device of claim 1, wherein the quantum dot layer comprises a quantum dot monolayer.

10. The device of claim 1, wherein the quantum dot layer comprises a quantum dot multilayer.

11. The device of claim 1, wherein the quantum dot layer is formed of a material chosen from II-VI group semiconductor compounds.

12. The device of claim 1, wherein the quantum dot layer is formed of quantum dots having an inner core of a first II-VI group semiconductor compound and an outer core of a second II-VI group semiconductor compound.

13. The device of claim 1, wherein the quantum dot layer is formed of quantum dots having an inner core of cadmium selenide (CdSe) and an outer core of zinc sulfide (ZnS).

14. The device of claim 1, wherein the quantum dot layer is formed of dots of a monodisperse size distribution.

15. The device of claim 1, wherein the quantum dot layer is formed of dots with a multidisperse size distribution.

16. The device of claim 1, wherein the quantum dot layer is disposed in clusters on the first layer.

17. The device of claim 1, wherein the second layer comprises a III nitride material.

18. The device of claim 2, wherein the encapsulation layer comprises a III nitride material.

19. A quantum dot optoelectronic device, comprising:
    a first layer of a first conductivity having a pitted surface on an upper surface of the first layer, the pitted surface having a plurality of pit openings;
    a plurality of quantum dots directly on the pitted surface of the first layer such that the quantum dots are in corresponding pit openings and that other portions of the upper surface of the first layer remain uncovered by plurality of quantum dots, sizes of the pit openings and the quantum dots being selected such that the pit openings trap the quantum dots, dislocations extending down through the first layer below the quantum dots; and
    a second layer of a second conductivity that is different from the first conductivity disposed directly on the quantum dots and on the other portions of the upper surface of the first layer.

20. The device of claim 19, wherein the second layer is an encapsulation layer.

21. The device of claim 19, further comprising a substrate, the first layer being disposed on the substrate.

22. The device of claim 21, wherein the substrate is formed of a material chosen from the group of electrical insulators.

23. The device of claim 21, wherein the substrate is formed of a material chosen from the group of semiconductors.

24. The device of claim 21, wherein the substrate includes at least one of sapphire, silicon, silicon dioxide, glass, silicon carbide, lithium niobate, lithium gallate, gallium nitride, aluminum nitride, aluminum gallium nitride, and zinc oxide.

25. The device of claim 19, wherein the first and second layers are formed of semiconductor materials having a bandgap wider than the bandgap of the quantum dots.

26. The device of claim 19, wherein the first layer comprises of a III nitride material layer.

27. The device of claim 19, wherein the plurality of pit openings are etch pits.

28. The device of claim 19, wherein the plurality of quantum dots is formed of a material chosen from II-VI group semiconductor compounds.

29. The device of claim 19, wherein the plurality of quantum dots is formed of quantum dots having an inner core of a first II-VI group semiconductor compound and an outer core of a second II-VI group semiconductor compound.

30. The device of claim 19, wherein the plurality of quantum dots is formed of quantum dots having an inner core of cadmium selenide (CdSe) and an outer core of zinc sulfide (ZnS).

31. The device of claim 19, wherein the plurality of quantum dots is formed of dots of a monodisperse particle size distribution.

32. The device of claim 19, wherein the plurality of quantum dots is formed of dots of a multidisperse particle size distribution.

33. The device of claim 19, wherein the plurality of quantum dots is disposed in clusters on the first conductive type layer.

34. The device of claim 19, wherein the second type layer comprises a III nitride material.

35. The device of claim 20, wherein the encapsulation layer comprises a III nitride material.

36. A quantum dot optoelectronic device, comprising:
a first layer of a first conductivity, an upper surface of the first layer including openings on dislocations in the first layer;
a quantum dot layer directly on only a portion of the upper surface of the first layer such that quantum dots are in the openings and that other portions of the upper surface of the first layer remain uncovered by the quantum dot layer, sizes of the openings and the quantum dots being selected such that the openings trap the quantum dots, the dislocations extending down through the first layer below the quantum dots: and
a second layer of a second conductivity that is different from the first conductivity directly on the quantum dot layer and on the other portions of the upper surface the first layer,
wherein:
the quantum dots are present as individual quantum dots or clusters of quantum dots, and
the quantum dots or clusters of quantum dots have a size ranging from 1 nm to greater than 1 micrometer.

37. The device of claim 1, wherein the quantum dots cover 5-95% of the upper surface of the first substrate.

38. The device of claim 1, wherein the quantum dot layer comprises a quantum dot multilayer, each layer of the multilayer having a pattern such that the patterns alternate.

39. The device of claim 16, wherein the quantum dots and/or clusters of quantum dots having a spacing in a same range as a size of the quantum dots and/or clusters of quantum dots.

40. The device of claim 19, wherein the quantum dots are present as individual quantum dots or clusters of quantum dots.

41. The device of claim 40, wherein the quantum dots or the clusters of quantum dots have a size ranging from 1 nm to greater than 1 micrometer.

42. The device of claim 40, wherein the quantum dots and/or clusters of quantum dots having a spacing in a same range as a size of the quantum dots and/or clusters of quantum dots.

43. The device of claim 19, wherein the quantum dots cover 5-95% of the pitted surface.

44. The device of claim 19, wherein the quantum dots comprise a quantum dot multilayer, each layer of the multilayer having a pattern such that the patterns alternate.

45. The device of claim 1, wherein the quantum dots are present as individual quantum dots or clusters of quantum dots.

46. A quantum dot optoelectronic device, comprising:
a first layer of a first conductivity having a pitted surface;
a plurality of quantum dots directly on the pitted surface of the first layer such that the quantum dots are in pits in the pitted surface of the first layer, sizes of the pits and the quantum dots being selected such that the pits trap the quantum dots, the quantum dot layer including a quantum dot multilayer, each layer of the multilayer having a pattern such that the patterns alternate; and
a second layer of a second conductivity that is different from the first conductivity disposed directly on the quantum dots and on the first layer other than the pits.

47. The device of claim 1, wherein the plurality of openings are etch pits.

48. The device of claim 1, wherein the first and second conductivities are opposite one another.

49. The device of claim 1, wherein the second layer is an intrinsic layer.

50. The device of claim 19, wherein the first and second conductivities are opposite one another.

51. The device of claim 19, wherein the second layer is an intrinsic layer.

52. The device of claim 46, wherein the first and second conductivities are opposite one another.

53. The device of claim 46, wherein the second layer is an encapsulation layer.

54. The device of claim 46, wherein the second layer is an intrinsic layer.

55. The device of claim 46, wherein the first and second conductivities are opposite one another.

56. The device of claim 46, wherein the second layer is an encapsulation layer.

57. The device of claim 46, wherein the second layer is an intrinsic layer.

* * * * *